United States Patent
Jaffari

(10) Patent No.: US 9,294,039 B2
(45) Date of Patent: Mar. 22, 2016

(54) CONSTANT GM BIAS CIRCUIT INSENSITIVE TO SUPPLY VARIATIONS

(71) Applicant: Samsung Display Co., Ltd., Yongin, Gyeonggi-Do (KR)

(72) Inventor: Nasrin Jaffari, Sunnyvale, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 18 days.

(21) Appl. No.: 14/180,287

(22) Filed: Feb. 13, 2014

(65) Prior Publication Data

US 2015/0054586 A1   Feb. 26, 2015

Related U.S. Application Data

(60) Provisional application No. 61/869,581, filed on Aug. 23, 2013.

(51) Int. Cl.
  H03F 3/04   (2006.01)
  H03F 1/02   (2006.01)
  H03F 3/16   (2006.01)
  G05F 3/24   (2006.01)
  (Continued)

(52) U.S. Cl.
  CPC .............. *H03F 1/0205* (2013.01); *G05F 3/24* (2013.01); *G05F 3/262* (2013.01); *H03F 1/30* (2013.01); *H03F 3/16* (2013.01); *H03F 3/45* (2013.01); *H03F 2200/18* (2013.01)

(58) Field of Classification Search
  CPC ........... H03F 3/16; H03F 1/30; H03F 1/0205; H03F 3/24; H03F 3/45; H03F 2200/18; G05F 3/24; G05F 3/262

USPC .............. 330/296, 257, 288; 327/53, 66, 132, 327/490; 345/204

See application file for complete search history.

(56) References Cited

U.S. PATENT DOCUMENTS 6,426,744 B2 *  7/2002  Hashimoto et al. ........... 345/214
7,265,625 B2 *  9/2007  Klemmer ...................... 330/261
(Continued)

FOREIGN PATENT DOCUMENTS

JP   2005-284544    10/2005
KR   2002-0081015   10/2002
(Continued)

OTHER PUBLICATIONS

European Search Report; Application Serial No. 14177535.3, dated Feb. 6, 2015, 4 sheets.

*Primary Examiner* — Steven J Mottola
*Assistant Examiner* — Hafizur Rahman
(74) *Attorney, Agent, or Firm* — Lewis Roca Rothgerber Christie LLP

(57) ABSTRACT

A bias circuit for biasing a field effect transistor (FET) to provide a transconductance ($g_m$) that is substantially unaffected by power supply voltage variations. In one embodiment the circuit includes two parallel current paths, each including two amplifying elements such as FETs, the FETs in one of the paths both being diode-connected, and the FETs in the other path not being diode-connected. Variations in the power supply voltage result in comparable changes in the voltage drops across all four FETs, and drain-induced barrier lowering (DIBL) results in relatively small changes in $g_m$ with changes in power supply voltage.

17 Claims, 11 Drawing Sheets

| | | | | | |
|---|---|---|---|---|---|
| (51) | Int. Cl. | | | 2007/0075778 A1 | 4/2007 Klemmer |
| | *H03F 1/30* | (2006.01) | | 2010/0134087 A1 | 6/2010 Hwang et al. |
| | *G05F 3/26* | (2006.01) | | 2010/0219804 A1 | 9/2010 Thorp |
| | *H03F 3/45* | (2006.01) | | 2011/0032023 A1 | 2/2011 Tanaka |

(56) References Cited

U.S. PATENT DOCUMENTS

2003/0214336 A1   11/2003   Watanabe
2006/0192608 A1   8/2006    Aota

FOREIGN PATENT DOCUMENTS

KR   2012-0010683   2/2012
KR   2012-0032888   4/2012
KR   2013-0061794   6/2013

* cited by examiner

| Device | Size | $g_m$ | $r_o$ | $Z_o$ |
|---|---|---|---|---|
| N1 | 5μm/0.18μm | 0.97mS | 37kΩ | 1.03kΩ |
| N2 | 10.8μm/0.18μm | 1.25mS | 40kΩ | 40kΩ |
| P1 | 60μm/0.18μm | 0.7mS | 800kΩ | 800kΩ |
| P2 | 60μm/0.18μm | 0.7mS | 800kΩ | 1.4kΩ |

*FIG. 4*

| Device | Size | $g_m$ | $r_o$ | $Z_o$ |
|---|---|---|---|---|
| N1 | 5μm/0.18μm | 0.95mS | 2.5kΩ | 2.5kΩ |
| N2 | 8μm/0.18μm | 1.5mS | 23kΩ | 0.67kΩ |
| P1 | 9μm/0.18μm | 0.3mS | 550kΩ | 550kΩ |
| P2 | 9μm/0.18μm | 0.3mS | 400kΩ | 3.3kΩ |

*FIG. 5*

CONSTANT GM BIAS CIRCUIT INSENSITIVE TO SUPPLY VARIATIONS

CROSS-REFERENCE TO RELATED APPLICATION(S)

The present application claims the benefit of Provisional Application No. 61/869,581, Filed Aug. 23, 2013, entitled "CONSTANT-GM BIAS CIRCUIT INSENSITIVE TO SUPPLY VARIATIONS", the entire content of which is incorporated herein by reference.

FIELD

The following description relates to bias circuitry, and in particular to a circuit for providing a bias to an amplifying element, in a manner that provides a bias point with a transconductance ($g_m$) that is substantially unaffected by power supply voltage variations.

BACKGROUND

In a circuit for providing a bias for a field-effect transistor (FET) in a transistor amplifier, it is desirable to provide a bias voltage for the gate of the transistor which results in a $g_m$ that is independent of power supply voltage fluctuations. Conventional bias circuits suffer from degraded performance when built with short-channel FETs, which, to a greater extent than long-channel FETs, exhibit drain-induced barrier lowering (DIBL). This DIBL causes the bias voltage generated by a conventional circuit to result in a $g_m$ that varies significantly with power supply voltage. Thus, there is a need for a bias circuit which generates a bias voltage that results in a $g_m$ that varies to an acceptably small extent with changes in the power supply voltage, and which can be constructed with short-channel FET devices.

SUMMARY

Aspects of embodiments of the present disclosure are directed toward a bias circuit for biasing a field effect transistor (FET) to provide a transconductance ($g_m$) that is substantially unaffected by power supply voltage variations. In one embodiment the circuit includes two parallel current paths, each including two amplifying elements such as FETs, the FETs in one of the paths both being diode-connected, and the FETs in the other path not being diode-connected. Variations in the power supply voltage result in comparable changes in the voltage drops across all four FETs, and drain-induced barrier lowering (DIBL) results in relatively small changes in $g_m$ with changes in power supply voltage.

According to an embodiment of the present invention there is provided a bias circuit, for providing a bias signal at a bias output connection, the bias circuit connected to a first power supply connection and to a second power supply connection, the bias circuit including: a current mirror, including a common terminal connected to the first power supply connection, a first current-carrying terminal and a second current-carrying terminal, the current mirror configured to source or sink a current, at the first current-carrying terminal, substantially equal to a current flowing out of or into the second current-carrying terminal; a first amplifying element; a second amplifying element; and a resistor, each of the first amplifying element and the second amplifying element including a first current-carrying terminal, a second current-carrying terminal and a control terminal, the first current-carrying terminal of the first amplifying element being connected to the first current-carrying terminal of the current mirror, the second current-carrying terminal of the first amplifying element being connected to the second power supply connection, a first terminal of the resistor being connected to the second current-carrying terminal of the current mirror, a second terminal of the resistor being connected the first current-carrying terminal of the second amplifying element, the second current-carrying terminal of the second amplifying element being connected to the second power supply connection, the control terminal of the first amplifying element being connected to the first terminal of the resistor and to the bias output connection, and the control terminal of the second amplifying element being connected to the second terminal of the resistor.

In one embodiment, the first amplifying element is a first N-channel field-effect transistor (FET) including a drain, a source, a gate, a channel length and a channel width; and the second amplifying element is a second N-channel FET including a drain, a source, a gate, a channel length and a channel width.

In one embodiment, the first current-carrying terminal of the first amplifying element is the drain of the first N-channel FET; the second current-carrying terminal of the first amplifying element is the source of the first N-channel FET; the first current-carrying terminal of the second amplifying element is the drain of the second N-channel FET; and the second current-carrying terminal of the second amplifying element is the source of the second N-channel FET.

In one embodiment, the channel width of the second N-channel FET is greater than the channel width of the first N-channel FET.

In one embodiment, the resistance of the resistor is substantially equal to 650 ohms.

In one embodiment, the current mirror includes a third amplifying element and a fourth amplifying element, each of the third amplifying element and the fourth amplifying element including a first current-carrying terminal, a second current-carrying terminal and a control terminal.

In one embodiment, the first current-carrying terminal of the third amplifying element is connected to the first current-carrying terminal of the fourth amplifying element, and the first current-carrying terminal of the third amplifying element is the common terminal of the current mirror; the control terminal of the third amplifying element is connected to the control terminal of the fourth amplifying element; the control terminal of the fourth amplifying element is connected to the second current-carrying terminal of the fourth amplifying element; the second current-carrying terminal of the third amplifying element is the first current-carrying terminal of the current mirror; and the second current-carrying terminal of the fourth amplifying element is the second current-carrying terminal of the current mirror.

In one embodiment, the third amplifying element is a first P-channel field-effect transistor (FET) including a drain, a source, a gate, a channel length and a channel width; and the fourth amplifying element is a second P-channel FET comprising a drain, a source, a gate, a channel length and a channel width.

In one embodiment, the first current-carrying terminal of the third amplifying element is the source of the first P-channel FET; the second current-carrying terminal of the third amplifying element is the drain of the first P-channel FET; the first current-carrying terminal of the fourth amplifying element is the source of the second P-channel FET; and the second current-carrying terminal of the fourth amplifying element is the drain of the second P-channel FET.

In one embodiment, the current mirror includes a third amplifying element, a fourth amplifying element, a fifth amplifying element, and a sixth amplifying element, each of the third amplifying element, the fourth amplifying element, the fifth amplifying element, and the sixth amplifying element including a first current-carrying terminal, a second current-carrying terminal and a control terminal.

In one embodiment, the third amplifying element and the fifth amplifying element are configured as a first cascode; and the fourth amplifying element and the sixth amplifying element are configured as a second cascode.

In one embodiment, the first current-carrying terminal of the third amplifying element is connected to the first current-carrying terminal of the fourth amplifying element, and the first current-carrying terminal of the third amplifying element is the common terminal of the current mirror; the control terminal of the third amplifying element is connected to the control terminal of the fourth amplifying element; the control terminal of the fourth amplifying element is connected to the second current-carrying terminal of the fourth amplifying element; the first current-carrying terminal of the fifth amplifying element is connected to the second current-carrying terminal of the third amplifying element; the first current-carrying terminal of the sixth amplifying element is connected to the second current-carrying terminal of the fourth amplifying element; the control terminal of the fifth amplifying element is connected to the control terminal of the sixth amplifying element; the control terminal of the sixth amplifying element is connected to the second current-carrying terminal of the sixth amplifying element; the second current-carrying terminal of the fifth amplifying element is the first current-carrying terminal of the current mirror; and the second current-carrying terminal of the sixth amplifying element is the second current-carrying terminal of the current mirror.

In one embodiment, the third amplifying element is a first P-channel field-effect transistor (FET) including a drain, a source, a gate, a channel length and a channel width; the fourth amplifying element is a second P-channel FET including a drain, a source, a gate, a channel length and a channel width; the fifth amplifying element is a third P-channel FET including a drain, a source, a gate, a channel length and a channel width; and the sixth amplifying element is a fourth P-channel FET including a drain, a source, a gate, a channel length and a channel width.

In one embodiment, the first current-carrying terminal of each of the third amplifying element, the fourth amplifying element, the fifth amplifying element, and the sixth amplifying element is the source of the corresponding P-channel FET; the second current-carrying terminal of each of the third amplifying element, the fourth amplifying element, the fifth amplifying element, and the sixth amplifying element is the drain of the corresponding P-channel FET; and the control terminal of each of the third amplifying element, the fourth amplifying element, the fifth amplifying element, and the sixth amplifying element is the gate of the corresponding P-channel FET.

BRIEF DESCRIPTION OF THE DRAWINGS

These and other features and advantages of the present invention will be appreciated and understood with reference to the specification, claims and appended drawings wherein:

FIG. 4 is a table of field effect transistor parameters used in a simulation of a related art bias circuit;
FIG. 5 is a table of field effect transistor parameters utilized in a simulation of a bias circuit according to an embodiment of the present invention.

DETAILED DESCRIPTION

The detailed description set forth below in connection with the appended drawings is intended as a description of exemplary embodiments of a constant $g_m$ bias circuit insensitive to supply variations provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

A transistor circuit, such as a transistor amplifier, may include transistors configured to amplify a signal, each connected to a bias circuit for maintaining a bias condition. Certain operating characteristics of a transistor amplifier, such as the transconductance $g_m$, may depend on the bias. If it is desired to keep these characteristics constant, then it is advantageous for the bias circuit to provide constant bias conditions, independent of, e.g., changes in a power supply voltage.

Figure 1:
FIG. 1 is a schematic diagram of a related art series circuit.

FIG. 1 shows a series circuit, which is a structure that may be used in constructing a bias circuit. Each of the elements $Z_i$ may be a passive element such as a resistor, or a more general element such as a transistor. The voltage drop across each of the elements $Z_i$ is given by $$V_{Zi} = \frac{Z_i}{\sum_{i=1}^{n} Z_i} Vdd. \tag{1}$$

where $Z_i$ is the impedance of the $i^{th}$ element and Vdd is the voltage at a first power supply connection, at one end of the series circuit, and where the voltage at the other end of the series circuit is ground, or zero volts. If the power supply voltage, i.e., the voltage at the first power supply connection, changes, then the change in the voltage across each element is given by:

$$\Delta V_{Zi} = \frac{Z_i}{\sum_{i=1}^{n} Z_i} \Delta Vdd. \quad (2)$$

The effective output impedance $Z_o$ of a transistor, such as a field-effect transistor (FET) depends on the manner in which the transistor is connected. For example, the output impedance $Z_o$ of a diode-connected FET, i.e., a FET configured with the gate connected to the drain, is $1/g_m$, where $g_m$ is the transconductance of the FET. A FET that is not diode-connected may have an effective output impedance $r_o$, where $r_o$ is the small signal resistance of the transistor, $$r_o = \left(\frac{\partial I}{\partial Vds}\right)^{-1}.$$

In general $r_o \gg 1/g_m$, and, as a result, in a circuit with two FETs connected in series between Vdd and ground, with one, referred to as M1, being diode-connected, and the other, referred to as M2, not being diode-connected, if Vdd changes by $\Delta Vdd$, then, according to equation (2), most of the change $\Delta Vdd$ will appear across M2, since it has the largest impedance.

Figure 2:
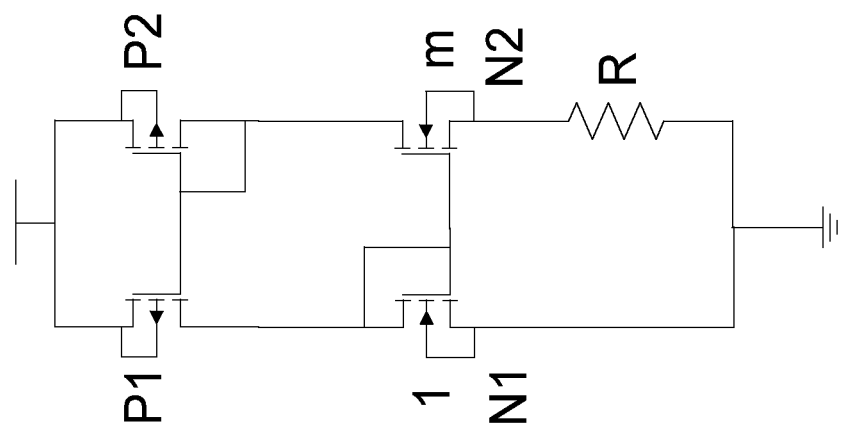
FIG. 2 is a schematic diagram of a related art bias circuit.

Referring to FIG. 2, a related art bias circuit includes four FETs N1, N2, P1, and P2. The size of FET N2 is m times that of FET N1, i.e., the channel of FET N2 is m times as wide as that of FET N1. The overdrive voltage, $V_{ov}$, of a FET is defined $$V_{ov} = V_{gs} - V_T$$

where $V_{gs}$ is the gate-source voltage, and $V_T$ is the threshold voltage, of the FET.

From an application of Kirchhoff's voltage law to the loop including ground, the source and gate of FET N1, the gate and source of FET N2, and the resistor R, to find the voltage across the resistor R, it follows that the current I, through the resistor R is:

$$I = \frac{V_{gs\_N1} - V_{gs\_N2}}{R}$$
$$= \frac{(V_{ov\_N1} - V_{ov\_N2}) + (V_{T\_N1} - V_{T\_N2})}{R},$$

where the subscript suffixes "_N1" and "_N2" identify quantities related to FET N1 and FET N2, respectively. Assuming $$(V_{T\_N1} - V_{T\_N2}) = 0,$$

it follows that $$I \cong \frac{V_{ov\_N1}\left(1 - \frac{1}{\sqrt{m}}\right)}{R}.$$

The $g_m$ of a FET may be calculated from the expression $$g_m = \frac{2I_{ds}}{V_{OV}};$$

utilizing this expression yields, for the $g_m$ of FET N1

$$g_{m\_N1} = \frac{2I}{V_{OV\_N1}} = \frac{2\left(1 - \frac{1}{\sqrt{m}}\right)}{R},$$

which can be seen to be independent of $\Delta Vdd$. Thus, to the extent that the assumption $(V_{T\_N1} - V_{T\_N2}) = 0$ holds, the gate of FET N1 may be connected to the gate of a similar transistor in another circuit, such as an amplifier, to bias the other transistor, and the other transistor will be biased so that its $g_m$ is also substantially independent of power supply voltage variations.

In general, however, the assumption $$(V_{T\_N1} - V_{T\_N2}) = 0$$

does not hold perfectly, as a FET's threshold voltage is dependent on its drain-source voltage $V_{ds}$ due to drain-induced barrier lowering (DIBL). This effect is more important in short-channel FETs than in long-channel FETs. As a result, a bias circuit constructed with short-channel FETs, according to the diagram of FIG. 2, will exhibit a variation in the $g_m$ of FET N1 as the power supply voltage varies. In particular, when the power supply voltage varies by $\Delta Vdd$, the drain-source voltage change across FETs N1 and N2 may be estimated using equation (2). FETs N1 and P1 are in series, FET N1 is diode-connected, and FET P1 is not diode connected. As a result, the effective output impedance of FET N1 is less than that of FET P1, most of $\Delta Vdd$ will appear across FET P1, and $V_{ds\_N1}$, the drain-source voltage of FET N1, will vary only slightly. FETs N2 and P2 are also in series. In this pair of FETs, FET P2 is diode-connected, and FET N2 is not diode connected. As a result, the effective output impedance of FET P2 is less than that of FET N2, most of $\Delta Vdd$ will appear across FET N2, and $V_{ds\_N2}$, the drain-source voltage of FET N2, will vary significantly when Vdd changes. Thus, when Vdd changes, $$(\Delta V_{ds\_N1} \neq \Delta V_{ds\_N2})$$

and, because of the effects of DIBL, $$(\Delta V_{T\_N1} \neq \Delta V_{T\_N2}).$$

Consequently, for this circuit, $g_{m\_N1}$ changes when the power supply voltage Vdd changes.

Figure 3:
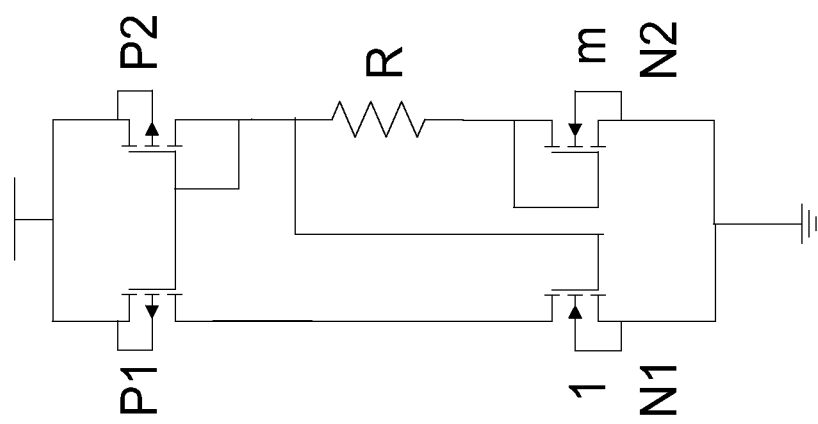
FIG. 3 is a schematic diagram of a bias circuit according to an embodiment of the present invention.

Referring to FIG. 3, in one embodiment of the present invention, a bias circuit includes four amplifying elements. Each of these amplifying elements, which may be FETs N1, N2, P1, and P2, has three terminals, two current-carrying terminals, which may be the source and the drain, and a control terminal, which may be the gate. The size of FET N2 is m times that of FET N1, i.e., the number m is the ratio of the channel width of FET N2 to the channel width of FET N1.

From an application of Kirchhoff's voltage law to the loop including ground, the source and gate of FET N1, the resistor R, and the gate and source of FET N2, to find the voltage across the resistor R, it follows that the current I, through the resistor R is:

$$I = \frac{V_{gs\_N1} - V_{gs\_N2}}{R}$$
$$= \frac{(V_{ov\_N1} - V_{ov\_N2}) + (V_{T\_N1} - V_{T\_N2})}{R}.$$

The circuit of FIG. 3 provides two parallel paths for current to flow between Vdd and ground, a first path containing the FETs P1 and N1, and a second path containing the FETs P2 and N2, and the resistor R. FETs P1 and P2, having their respective sources and gates connected, are configured to act as a current mirror, so that the current through the two FETs is substantially the same: $I_{ds\_P1} = I_{ds\_P2}$, where the subscript suffixes "_P1" and "_P2" identify quantities related to FET P1 and FET P2, respectively. From the assumption that $$(V_{T\_N1} - V_{T\_N2}) = 0,$$

and from the approximation that for a FET operating in the saturation (active) region, $I_{ds}$ is proportional to the channel width times $V_{OV}^2$ it then follows that $$I \cong \frac{V_{OV\_N1}\left(1 - \frac{1}{\sqrt{m}}\right)}{R}.$$

In this embodiment, the assumption $(V_{T\_N1} - V_{T\_N2}) = 0$ is substantially true for both long-channel and short-channel FETs, because the output impedances of FETs N1 and P1, and of FETs N2 and P2, are more nearly the same. In particular, FETs N1 and P1 are both not diode connected, as a result of which their respective output impedances are comparable, and, by equation (2), $V_{ds\_N1}$ changes moderately when the power supply voltage varies by ΔVdd. FETs N2 and P2 are both diode connected, so that their respective output impedances are also comparable, and, assuming that the resistance of the resistor R is relatively small, $V_{ds\_N2}$ also changes moderately when the power supply voltage varies by ΔVdd, which again follows from equation (2).

Thus, when there is a change ΔVdd in the power supply voltage, for the circuit of FIG. 3 the change in $V_{ds\_N1}$ is more nearly the same as the change in $V_{ds\_N2}$, than for the circuit in FIG. 2, and the assumption $$(V_{T\_N1} - V_{T\_N2}) = 0$$

is more nearly correct for the circuit of FIG. 3. As a result, the performance of the circuit of FIG. 3 as a constant $g_m$ bias circuit is superior.

Figure 6:
FIG. 6 is a table of simulated changes in the voltage drop across two field effect transistors in a first, related art, simulated circuit, and of changes in the voltage drop across two field effect transistors in a second circuit simulated according to an embodiment of the present invention.

The conclusions of this qualitative analysis are borne out by numerical simulation, in which the circuits of FIG. 2 and FIG. 3 were simulated with values of R and FET parameters selected to achieve similar characteristics in the two circuits, in terms of FET sizing, $g_m$, and current consumption. A first circuit constructed according to the schematic diagram of FIG. 2, with R=900Ω, and with four FETs, N1, N2, P1, and P2 having the parameters shown in FIG. 4, shows, in simulation, for ΔVdd=400 mV, a change in $V_{ds\_N1}$ of 0.4 mV, and a change in $V_{ds\_N2}$ of 376 mV (FIG. 6), i.e., a difference of over 375 mV.

By comparison, a second circuit constructed according to the schematic diagram of FIG. 3, with R=650Ω, and with four FETs, N1, N2, P1, and P2 having the parameters shown in FIG. 5, shows, in simulation, for ΔVdd=400 mV, a change in $V_{ds\_N1}$ of 2 mV, and a change in $V_{ds\_N2}$ of 60 mV, i.e., a difference of 58 mV, which is smaller than 375 mV by a factor of more than six.

Figure 7:
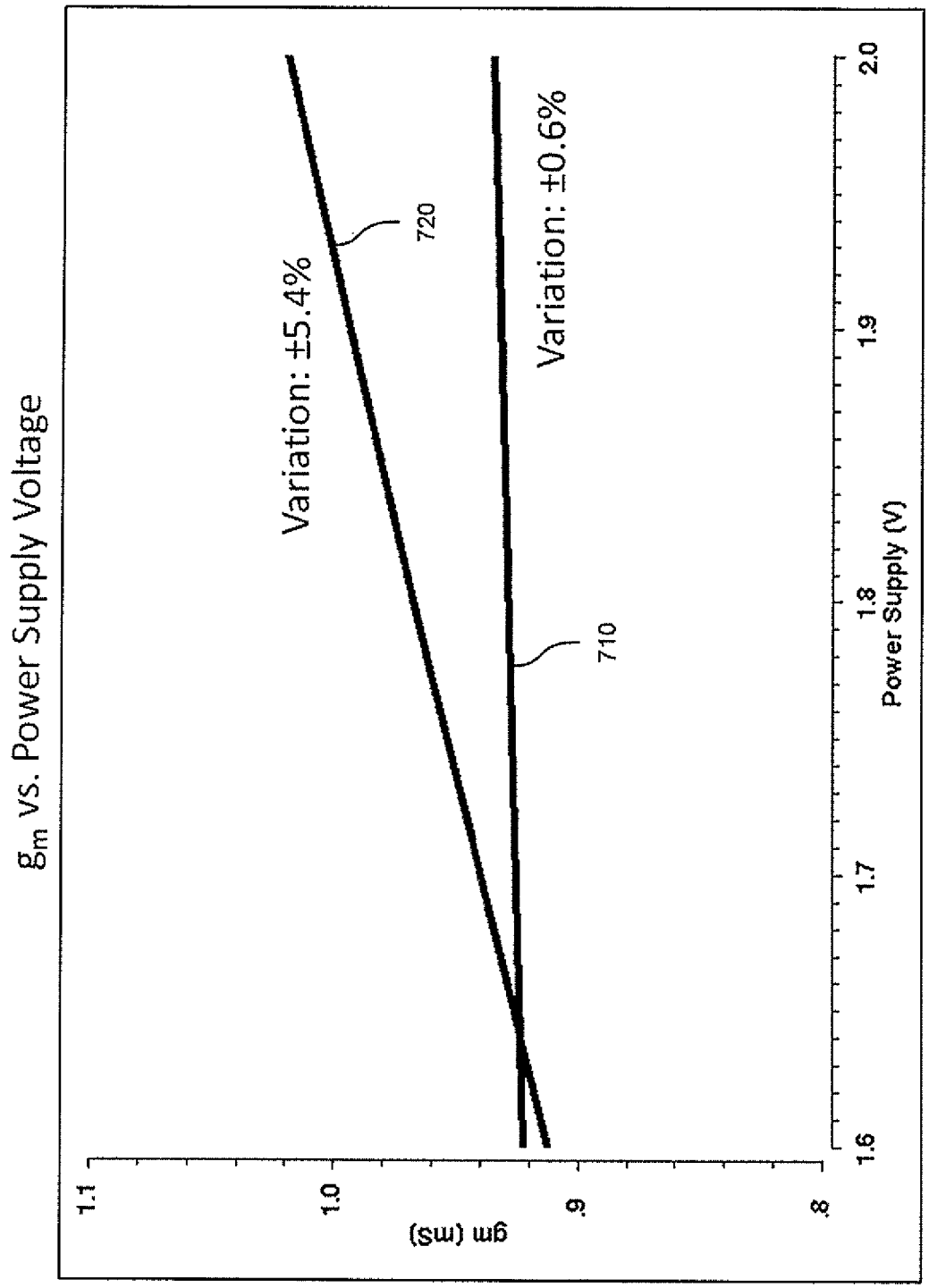
FIG. 7 is a graph of the variation of the transconductance of a field effect transistor with power supply voltage in a related art circuit, and in a circuit according to an embodiment of the present invention.

As illustrated in FIG. 7, the variation in $g_m$ with power supply voltage shown in simulation is ±0.6% for the circuit of FIG. 3, as can be seen in the line 710 representing the variation of $g_m$ with power supply voltage for that circuit. This is considerably less than the variation in $g_m$ with power supply voltage for the circuit of FIG. 2, which is ±5.4%, as can be seen in the line 720 representing the variation of $g_m$ with power supply voltage for that circuit.

The circuit of FIG. 3 may be used to bias another amplifying element, by connecting the control terminal of the amplifying element N1 to the control terminal of another, similar, amplifying element in another circuit, in which the other amplifying element may, for example, be a component in an amplifier. In particular, referring to FIG. 8A, if the amplifying elements are FETs, then the gate of the N-channel FET N1 may serve as a bias output, which may be connected to the gate of a similar N-channel FET, to bias it, in another circuit.

Figure 8B:
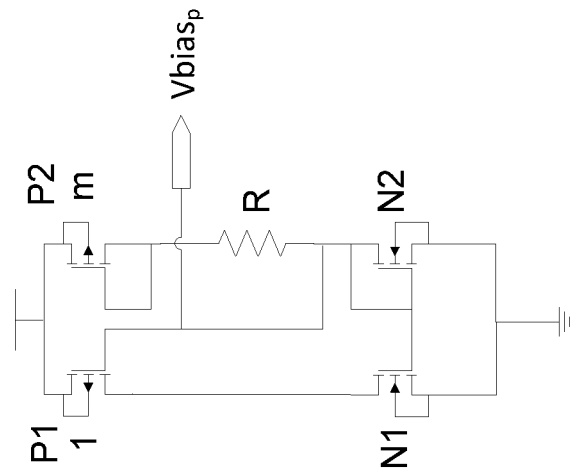
FIG. 8B is a schematic diagram of a circuit having a bias output according to another embodiment of the present invention.

Referring to FIG. 8B, a complementary circuit may be used to provide a bias output from the gate of the P-channel FET P1, for a similar P-channel FET in another circuit.

Figure 8A:
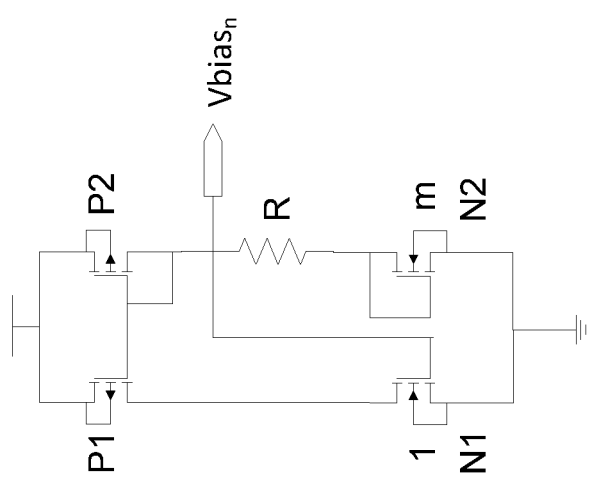
FIG. 8A is a schematic diagram of a circuit having a bias output according to an embodiment of the present invention.
Figure 9:
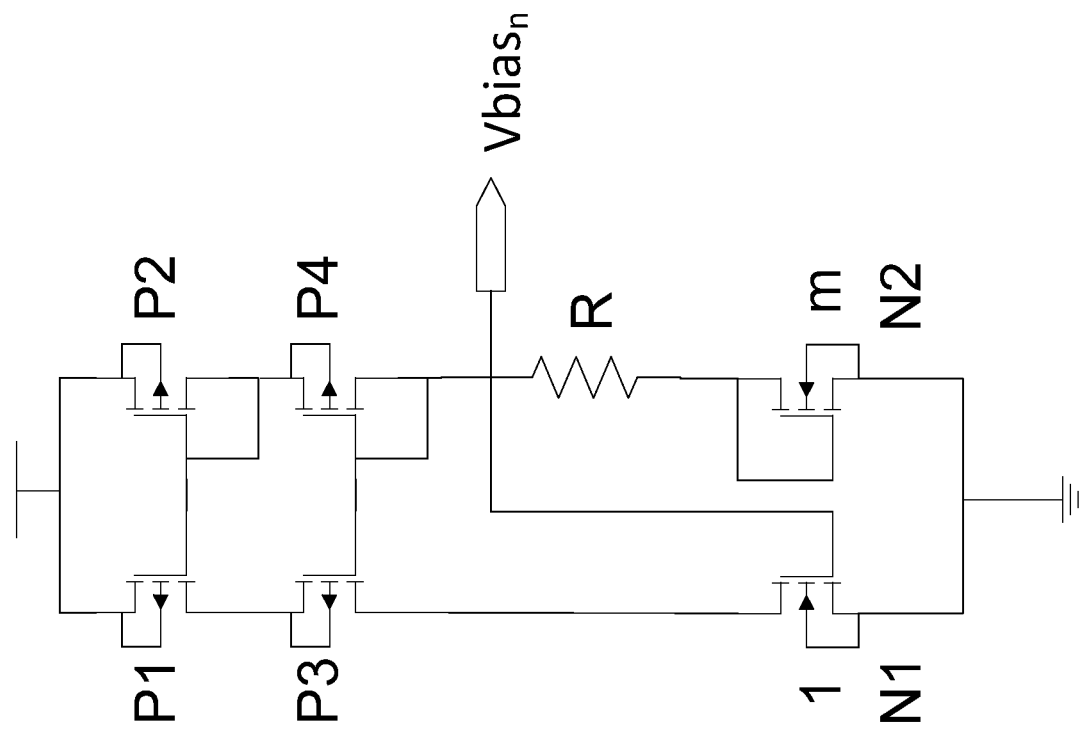
FIG. 9 is a schematic diagram of a circuit including a cascode current mirror according to an embodiment of the present invention.
Figure 10:
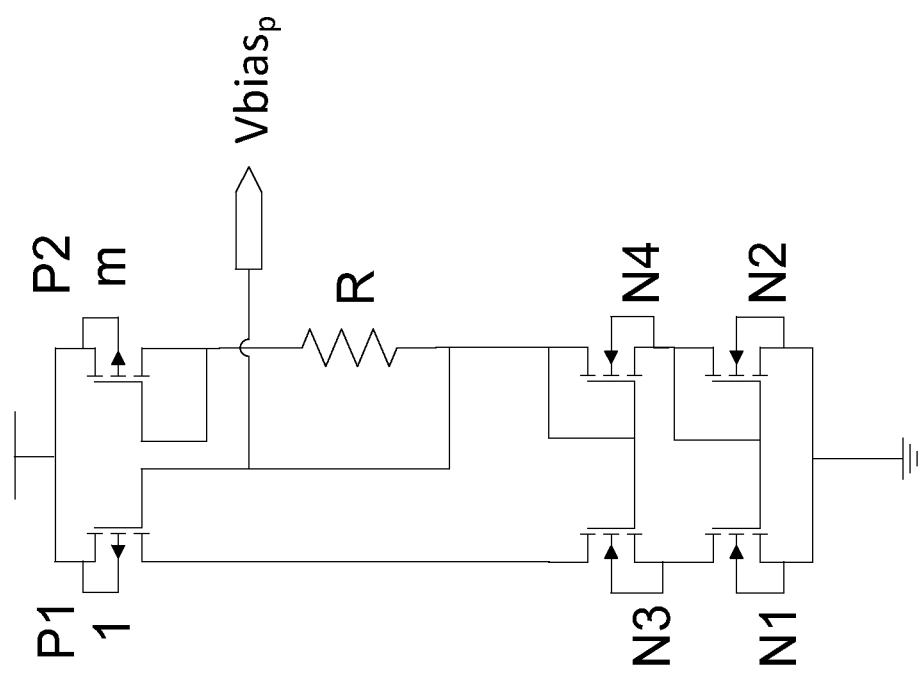
FIG. 10 is a schematic diagram of a circuit including a cascode current mirror according to another embodiment of the present invention.

In the circuits of FIG. 3 and FIG. 8A, the FETs P1 and P2 are configured as a current mirror. In other embodiments, a current mirror may be formed using other configurations. Referring to FIG. 9, for example a current mirror may be formed using four amplifying elements, such as the FETs P1, P2, P3, and P4, arranged in a cascode configuration as shown. Similarly, the current mirror which in FIG. 8B consists of the FETs N1 and N2 may be replaced, with the four FETs N1, N2, N3, and N4, arranged in a cascode configuration as shown in FIG. 10.

Figure 11:
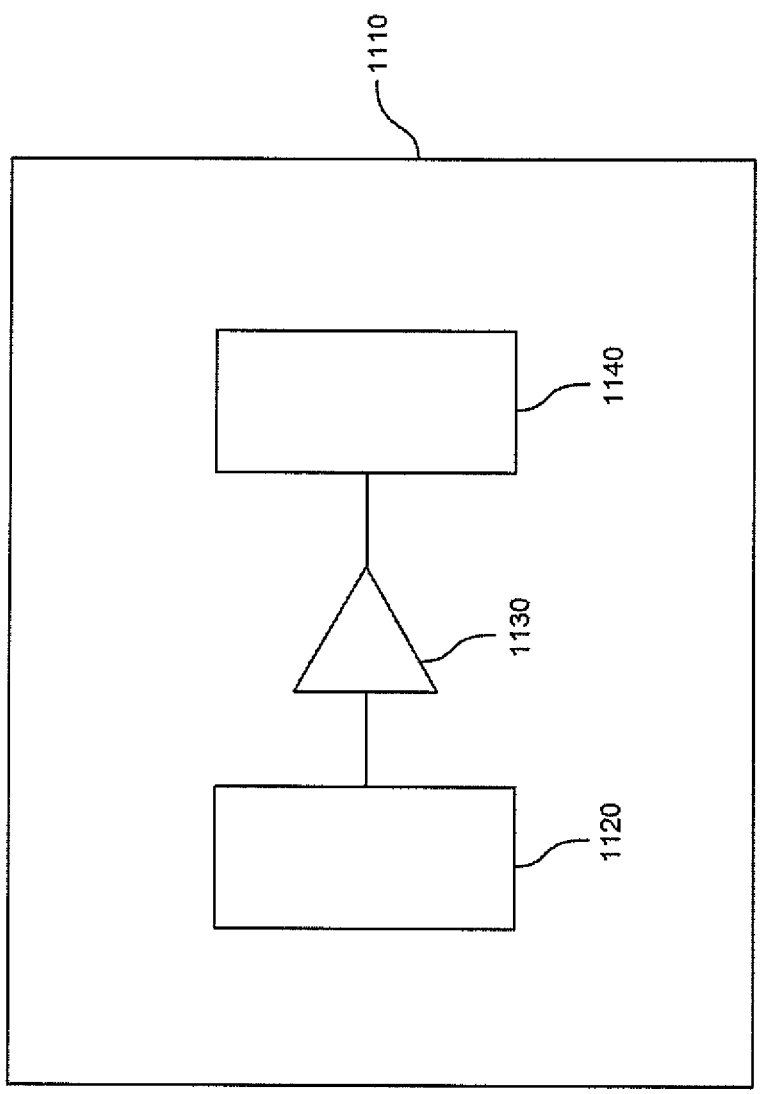
FIG. 11 is a block diagram of a display including a bias circuit according to an embodiment of the present invention.

Embodiments of the present invention may be used in displays, e.g., organic light emitting diode (OLED) displays or liquid crystal displays (LCDs). Referring to FIG. 11, in one embodiment a display 1110 may include a digital to analog converter 1120, the output of which drives an amplifier 1130. The amplifier 1130 may in turn drive another element, such as a display electrode 1140. The digital to analog converter 1120 and the amplifier 1130 may have transistors configured as amplifiers that amplify analog signals, and for these transistors a bias voltage which results in a $g_m$ that is substantially independent of the power supply voltage may be important. Embodiments of the present invention may be used to provide such a bias voltage.

Although exemplary embodiments of a constant $g_m$ bias circuit insensitive to supply variations have been specifically described and illustrated herein, many modifications and variations will be apparent to those skilled in the art. Accordingly, it is to be understood that a constant $g_m$ bias circuit insensitive to supply variations constructed according to principles of this invention may be embodied other than as specifically described herein. The invention is also defined in the following claims, and equivalents thereof.

What is claimed is:

1. A bias circuit, for providing a bias signal at a bias output connection, the bias circuit connected to a first power supply connection and to a second power supply connection, the bias circuit comprising:
    a current mirror, comprising a common terminal connected to the first power supply connection, a first current-carrying terminal and a second current-carrying terminal, the current mirror configured to source or sink a current, at the first current-carrying terminal, substantially equal to a current flowing out of or into the second current-carrying terminal;
    a first amplifying element;
    a second amplifying element; and a resistor, each of the first amplifying element and the second amplifying element comprising a first current-carrying terminal, a second current-carrying terminal and a control terminal, the first current-carrying terminal of the first amplifying element being connected to the first current-carrying terminal of the current mirror, the second current-carrying terminal of the first amplifying element being connected to the second power supply connection, a first terminal of the resistor being connected to the second current-carrying terminal of the current mirror, a second terminal of the resistor being connected to the first current-carrying terminal of the second amplifying element, the second current-carrying terminal of the second amplifying element being connected to the second power supply connection, the control terminal of the first amplifying element being connected to the first terminal of the resistor and to the bias output connection, and the control terminal of the second amplifying element being connected to the second terminal of the resistor.

2. The bias circuit of claim 1, wherein:
the first amplifying element is a first N-channel field-effect transistor (FET) comprising a drain, a source, a gate, a channel length and a channel width; and
the second amplifying element is a second N-channel FET comprising a drain, a source, a gate, a channel length and a channel width.

3. The bias circuit of claim 2, wherein:
the first current-carrying terminal of the first amplifying element is the drain of the first N-channel FET;
the second current-carrying terminal of the first amplifying element is the source of the first N-channel FET;
the first current-carrying terminal of the second amplifying element is the drain of the second N-channel FET; and
the second current-carrying terminal of the second amplifying element is the source of the second N-channel FET.

4. The bias circuit of claim 3, wherein the channel width of the second N-channel FET is greater than the channel width of the first N-channel FET.

5. The bias circuit of claim 3, wherein the resistance of the resistor is substantially equal to 650 ohms.

6. The bias circuit of claim 1, wherein the current mirror comprises a third amplifying element and a fourth amplifying element, each of the third amplifying element and the fourth amplifying element comprising a first current-carrying terminal, a second current-carrying terminal and a control terminal.

7. The bias circuit of claim 6, wherein:
the first current-carrying terminal of the third amplifying element is connected to the first current-carrying terminal of the fourth amplifying element, and the first current-carrying terminal of the third amplifying element is the common terminal of the current mirror;
the control terminal of the third amplifying element is connected to the control terminal of the fourth amplifying element;
the control terminal of the fourth amplifying element is connected to the second current-carrying terminal of the fourth amplifying element;
the second current-carrying terminal of the third amplifying element is the first current-carrying terminal of the current mirror; and the second current-carrying terminal of the fourth amplifying element is the second current-carrying terminal of the current mirror.

8. The bias circuit of claim 7, wherein:
the third amplifying element is a first P-channel field-effect transistor (FET) comprising a drain, a source, a gate, a channel length and a channel width; and
the fourth amplifying element is a second P-channel FET comprising a drain, a source, a gate, a channel length and a channel width.

9. The bias circuit of claim 8, wherein:
the first current-carrying terminal of the third amplifying element is the source of the first P-channel FET;
the second current-carrying terminal of the third amplifying element is the drain of the first P-channel FET;
the first current-carrying terminal of the fourth amplifying element is the source of the second P-channel FET; and
the second current-carrying terminal of the fourth amplifying element is the drain of the second P-channel FET.

10. The bias circuit of claim 1, wherein the current mirror comprises a third amplifying element, a fourth amplifying element, a fifth amplifying element, and a sixth amplifying element, each of the third amplifying element, the fourth amplifying element, the fifth amplifying element, and the sixth amplifying element comprising a first current-carrying terminal, a second current-carrying terminal and a control terminal.

11. The bias circuit of claim 10, wherein:
the third amplifying element and the fifth amplifying element are configured as a first cascode; and
the fourth amplifying element and the sixth amplifying element are configured as a second cascode.

12. The bias circuit of claim 10, wherein:
the first current-carrying terminal of the third amplifying element is connected to the first current-carrying terminal of the fourth amplifying element, and the first current-carrying terminal of the third amplifying element is the common terminal of the current mirror;
the control terminal of the third amplifying element is connected to the control terminal of the fourth amplifying element;
the control terminal of the fourth amplifying element is connected to the second current-carrying terminal of the fourth amplifying element;
the first current-carrying terminal of the fifth amplifying element is connected to the second current-carrying terminal of the third amplifying element;
the first current-carrying terminal of the sixth amplifying element is connected to the second current-carrying terminal of the fourth amplifying element;
the control terminal of the fifth amplifying element is connected to the control terminal of the sixth amplifying element;
the control terminal of the sixth amplifying element is connected to the second current-carrying terminal of the sixth amplifying element;
the second current-carrying terminal of the fifth amplifying element is the first current-carrying terminal of the current mirror; and
the second current-carrying terminal of the sixth amplifying element is the second current-carrying terminal of the current mirror.

13. The bias circuit of claim 10, wherein:
the third amplifying element is a first P-channel field-effect transistor (FET) comprising a drain, a source, a gate, a channel length and a channel width;

the fourth amplifying element is a second P-channel FET comprising a drain, a source, a gate, a channel length and a channel width;

the fifth amplifying element is a third P-channel FET comprising a drain, a source, a gate, a channel length and a channel width; and the sixth amplifying element is a fourth P-channel FET comprising a drain, a source, a gate, a channel length and a channel width.

14. The bias circuit of claim 13, wherein:

the first current-carrying terminal of each of the third amplifying element, the fourth amplifying element, the fifth amplifying element, and the sixth amplifying element is the source of the corresponding P-channel FET;

the second current-carrying terminal of each of the third amplifying element, the fourth amplifying element, the fifth amplifying element, and the sixth amplifying element is the drain of the corresponding P-channel FET; and the control terminal of each of the third amplifying element, the fourth amplifying element, the fifth amplifying element, and the sixth amplifying element is the gate of the corresponding P-channel FET.

15. A display comprising the bias circuit of claim 1.

16. The display of claim 15, wherein the display is an organic light emitting diode (OLED) display.

17. The display of claim 15, wherein the display is a liquid crystal display (LCD).

* * * * *